(12) United States Patent
Boyd et al.

(10) Patent No.: US 7,002,214 B1
(45) Date of Patent: Feb. 21, 2006

(54) ULTRA-THIN BODY SUPER-STEEP RETROGRADE WELL (SSRW) FET DEVICES

(75) Inventors: Diane C. Boyd, LaGrangeville, NY (US); Judson R. Holt, Wappingers Falls, NY (US); MeiKei Ieong, Wappingers Falls, NY (US); Renee T. Mo, White Plains, NY (US); Zhibin Ren, Hopewell Junction, NY (US); Ghavam G. Shahidi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/710,736

(22) Filed: Jul. 30, 2004

(51) Int. Cl.
*H01L 27/12* (2006.01)
(52) U.S. Cl. ...................... 257/351; 257/347; 438/153; 438/154
(58) Field of Classification Search ................ 257/351, 257/347; 438/153, 154, 149, 479, 517
See application file for complete search history.

(56) References Cited

U.S. PATENT DOCUMENTS

| | | | |
|---|---|---|---|
| 6,084,271 A | 7/2000 | Yu et al. | |
| 6,323,073 B1 | 11/2001 | Yeh et al. | |
| 6,495,401 B1 | 12/2002 | Hsu | |
| 6,501,134 B1 | 12/2002 | Krivokapic | |
| 6,730,568 B1 | 5/2004 | Sohn | |
| 2002/0033511 A1 | 3/2002 | Babcock et al. | |
| 2002/0060338 A1* | 5/2002 | Zhang ........................ | 257/328 |
| 2003/0170936 A1* | 9/2003 | Christensen et al. ......... | 438/151 |
| 2004/0256700 A1* | 12/2004 | Doris et al. .................. | 257/627 |

* cited by examiner

*Primary Examiner*—Douglas W Owens
(74) *Attorney, Agent, or Firm*—Graham S. Jones, II; H. Daniel Schnurmann (57) ABSTRACT

A method of manufacture of a Super Steep Retrograde Well Field Effect Transistor device starts with an SOI layer formed on a substrate, e.g. a buried oxide layer. Thin the SOI layer to form an ultra-thin SOI layer. Form an isolation trench separating the SOI layer into N and P ground plane regions. Dope the N and P ground plane regions formed from the SOI layer with high levels of N-type and P-type dopant. Form semiconductor channel regions above the N and P ground plane regions. Form FET source and drain regions and gate electrode stacks above the channel regions. Optionally form a diffusion retarding layer between the SOI ground plane regions and the channel regions.

20 Claims, 11 Drawing Sheets

ULTRA-THIN BODY SUPER-STEEP RETROGRADE WELL (SSRW) FET DEVICES

BACKGROUND OF INVENTION

This invention relates to and methods of manufacture of ultra-thin body Field Effect Transistor (FET) devices as well as the ultra-thin body FET devices produced thereby.

In semiconductor devices Field Effect Transistors (FETs) such as Complementary Metal Oxide Semiconductor (MOS) FETs or Metal Insulator Semiconductor (MIS) FETs, the trend continues to be a steady reduction in the minimum feature size of the devices. The reduction of the minimum transistor gate length, realizable on a chip, has helped the microelectronic industry to produce products with a resultant spectacular increase in computational capability and integration density.

Figure 1:
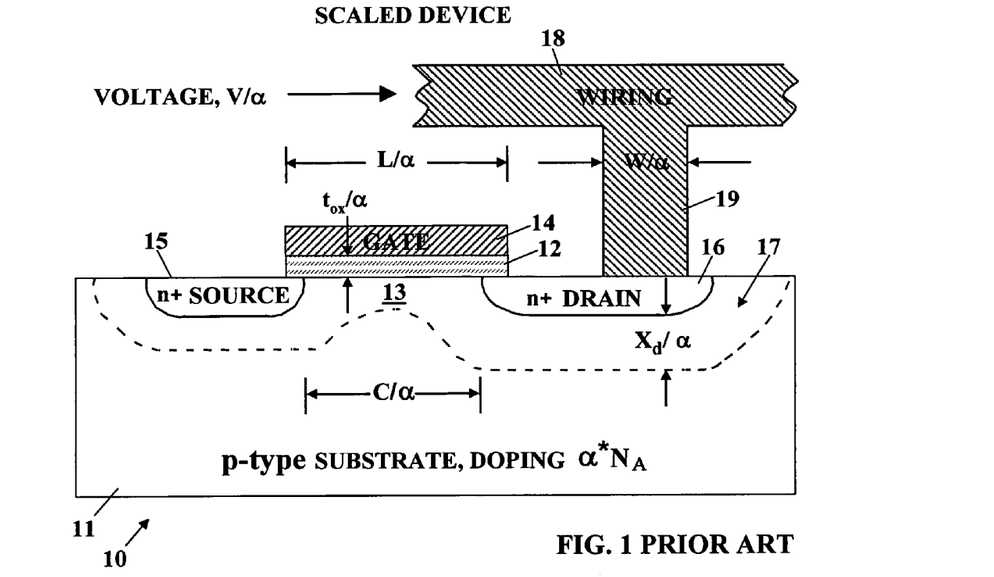
FIG. 1 shows a conventional prior art MOSFET device formed on a p-type doped silicon substrate.

FIG. 1 shows a conventional prior art MOSFET device 10 formed on a p-type doped silicon substrate 11. A gate dielectric layer 12 (e.g. gate oxide) and a gate electrode 14 (e.g. doped polysilicon) are formed as a gate electrode stack on the top surface of the substrate with an n+ doped source region 15 and an n+ doped drain region 16 formed alongside the gate electrode 14 with a channel region 13 therebetween below the gate electrode 14. Voltage V is connected to the drain region 16 through wiring 18 which connects to drain contact 19.

In principle, such devices as Complementary MOSFET devices or Complementary MISFET devices can be made smaller and smaller. However, if only the length "L" of the gate electrode is scaled down, i.e. reduced in scale, without changing other parameters of an FET device, the drain-field will have more and more influence upon the channel region as compared to the influence which can be exerted by the gate electrode.

Eventually, as a function of the reduction in scale, the gate electrode can lose control of the channel region and a punch-through condition occurs in the FET device as explained in S. M. Sze "Semiconductor Devices Physics and Technology", John Wiley & Sons, page 213 (1985) because the channel width is too narrow or too short. This is the so-called Short-Channel-Effect (SCE). A device encumbered by an SCE condition ceases to function as an electronic switch if the gate electrode fails to turn off the FET effectively.

On the other hand, referring again to FIG. 1, to reduce the scale of the MOSFET devices by a divisor $\alpha$ which is a number larger than "1", the vertical dimensions (gate oxide thickness $t_{ox}$, junction depth, and depletion width $x_d$ shown in FIG. 1) must be scaled down to be commensurate with the lateral dimension, such as the length "L" of the gate electrode 14, the width "W" of drain contact 18, and width "C" of the channel 13. This guideline guarantees appropriate proper device characteristics when a larger device 10 is scaled down to a smaller device by the scaling divisor $\alpha$.

The depletion width $x_d$ in region 17 below the source region 15 and drain region 16 is reduced by increasing the concentration of dopant that is present in the substrate 11. However, increasing the dopant concentration to an excessively high level will degrade the performance of the device 10 because of increased threshold voltage Vt, junction capacitance, and junction leakage. The mobility is also reduced as a function of higher substrate doping.

A Super-Steep Retrograde Well (SSRW) has a low-high-low (low-high) channel doping profile which can improve the control of Short-Channel Effect (SCE) without degrading mobility. However, the doping level in the ground plane is generally high, which could cause increased junction leakage and increased junction capacitance.

Figure 2:
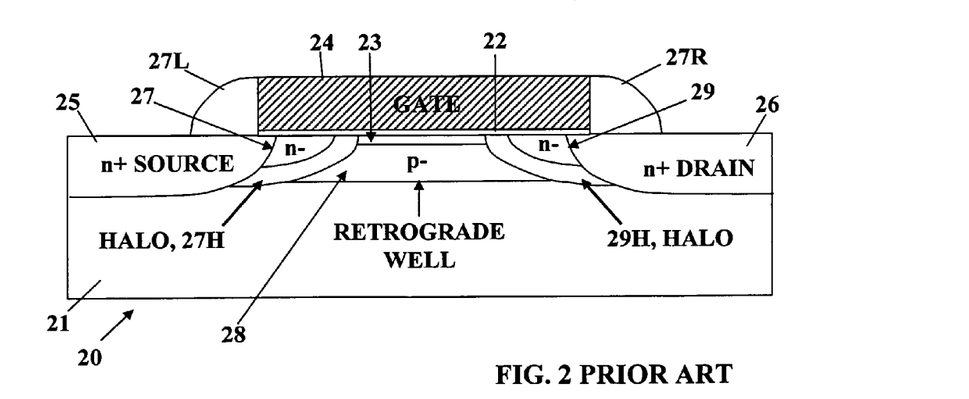
FIG. 2 shows an example of a prior art SSRW type of MOSFET device formed on a p-type doped silicon substrate.

FIG. 2 shows an example of a prior art SSRW type of MOSFET device 20 formed on a p-type doped silicon substrate 21. A gate dielectric layer 22 (e.g. gate oxide) and a gate electrode 24 (e.g. doped polysilicon) are formed as a gate electrode stack on the top surface of the substrate with an n+ doped source region 25 and an n+ doped drain region 26 formed alongside the gate electrode 24 with a channel region 23 therebetween below the gate electrode 24. The device includes n− lightly doped source (LDS) regions 27 adjacent to the source regions 25 and an n− lightly doped drain (LDD) region 29 adjacent to the drain region 26 reaching under the gate electrode 24, respectively. A source halo region 27L extends between the LDS region 25 and the left edge of the channel 23. A drain halo region 29H extends between the LDD region 29 and the right edge of the channel 23. A Super Steep Retrograde Well (SSRW) 24 is formed in the substrate 21 with a retrograde dopant profile which involves a relatively low dopant concentration formed in the channel 23 just below the gate dielectric layer 22. In a SSRW device the dopant concentration increases sharply as a function of distance from the gate dielectric layer 22 and then levels off deeper into the channel region 23. (See page 9 of Thompson et al. "MOS Scaling: Transistor Challenges for the 21st Century" Intel Technology Journal Q3'98 pp 1–19) which states at page 9 that "The retrograde profile is typically created by using a slow diffusing dopant species such as arsenic or antimony for PMOS devices and indium for NMOS devices."

An ultra-thin SOI MOSFET (with SOI thickness less than 50 nm) is another attractive option to reduce the vertical dimensions (such as junction depth and depletion width). It can effectively reduce the short-channel-effect and eliminate most of the leakage current.

U.S. Pat. No. 6,084,271 of Yu et al. entitled "Transistor with Local Insulator Structure", which describes a fully-depleted Silicon-On-Insulator (SOI) MOSFET states "According to conventional complimentary metal oxide semiconductor (CMOS) fabrication techniques, the reduction in the depletion layer thickness is realized by a super-step retrograded well (SSRW) ion implantation process. However, this process is limited by the diffusion of dopant atoms during subsequent thermal processes (e.g., annealing). The ion implantation process can generally only achieve an 80 nanometer or larger body thickness for a transistor. Thus, conventional fabrication techniques for bulk semiconductor type-devices cannot create transistors with body thickness less than 80 nm." "Accordingly, bulk semiconductor-type devices can be subject to disadvantageous properties due to the relatively large body thicknesses. These disadvantageous properties include less than ideal sub-threshold voltage rolloff, short channel effects (can change to "large subthreshold swing"), and drain induced barrier layering. Further still, bulk semiconductor-type devices can be subject to further disadvantageous properties such as high junction capacitance, ineffective isolation, and low saturation current. These properties are accentuated as transistors become smaller and transistor density increases on ICs."

U.S. Pat. No. 6,730,568 of Sohn entitled "Method for Fabricating Semiconductor Device with Ultra-Shallow Super-Steep-Retrograde Epi-Channel by Boron-Fluoride Compound Doping" describes a method for fabricating a semiconductor device with an epi-channel formed by ultra low energy ion implantation and by a laser thermal annealing (LTA) process. A field oxide layer with an (STI) structure is formed on a semiconductive substrate, and P-type dopants are ion-implanted into the substrate to form a P-type well. Sequentially, boron ions are implanted under ultra low energy (1 keV) to form a delta doped channel doping layer. Then, the laser thermal annealing (LTA) process is performed without pre-amorphization for amorphizing a surface of the semiconductor substrate. The laser thermal annealing process suppresses the redistribution of boron within the channel doping layer, as well as changing the channel doping layer into a chemically stable channel doping layer. Then an epitaxial layer is selectively grown on the channel doping layer at an elevated temperature to form a Super Steep Retrograde (SSR) epi-channel structure.

U.S. Pat. No. 6,323,073 of Yeh et al. entitled "Method for Forming Doped Regions on an SOI Device" states in the abstract that an SOI layer has a dielectric layer and a silicon layer formed on the dielectric layer. A Shallow Trench Isolation (STI) structure is formed on the silicon layer, which passes through to the dielectric layer. A thermal diffusion process is performed to drive dopants into a first region of the silicon layer forming an N-well or P-well doped region. Next, in a thermal diffusion process dopants are driven into a second region of the silicon layer so as to form a P-well or N-well doped region. Then, an epitaxial layer, about 200 angstroms thick, is grown on the surface of the silicon layer by an Molecular-Beam Epitaxy (MBE) growth process, a Liquid-Phase Epitaxy (LPE) growth process, or a Vapor-Phase Epitaxy (VPE) growth process. The Yeh et al. patent states, "In this manner, the doping concentration distribution presents an SSR distribution curve. Under the SSR distribution, the doping concentration is reduced in the region near the gate. This enhances the mobility of the electrons and holes in the channel, significantly improving the current velocity over the prior art. Additionally, short channel effects (SCE) are prevented. The junction capacitance (Cj) at the interface of the source and the well, and the drain and the well is also reduced, thus enhancing the electrical performance of the MOS transistor." U.S. patent application No. 20020033511 A1 of Babcock entitled "Advanced CMOS Using Super Steep Retrograde Wells" states that "The use of super steep retrograde wells with intrinsically doped channel regions has significant performance advantages for CMOS devices. These advantages include reduction of short channel effects, increased mobility in the channel region, higher mobility, less parasitic capacitance, and a reduction in short channel effects. Although the super steep retrograde wells have significant advantages for advanced CMOS devices, it is very difficult to achieve these structures when manufacturing these devices for high volume integrated circuit applications. This difficulty is due to the out-diffusion of the retrograde well dopant species into the channel region especially for p-well device such as the NMOS transistor. In fact, it has been shown that current silicon processing techniques will not be able to achieve stringent doping profiles that are targeted to change by as much as three orders of magnitude in less then 4 nm by the year 2008. There is therefore a great need for new processing techniques that will allow the formation of super steep retrograde well structures with near intrinsic transistor channel regions." In claim 1, Babcock et al. states as follows:

A transistor with a SSRW, comprising: providing a semiconductor substrate with an upper surface; a capping layer containing carbon positioned at a first distance beneath the upper surface of the substrate; a retrograde well region in the substrate positioned beneath capping layer; source and drain regions in said substrate positioned above said capping layer and separated by a second distance; a gate dielectric layer on the upper surface of the substrate; and a conductive gate layer on the gate dielectric layer positioned between said source and drain regions.

An ultra-thin SOI CMOS FET or CMIS FET (with SOI thickness less than 50 nm) is another attractive option to reduce the vertical dimensions (such as junction depth and depletion width). It can effectively reduce the short-channel-effect and eliminate most of the leakage current.

U.S. Pat. No. 6,495,401 of Hsu entitled "Method of Forming an Ultra-Thin SOI MOS Transistor" states that a silicon wafer has an oxide layer formed thereon. A top silicon layer is deposited by state of the art deposition techniques on the oxide layer. The top silicon layer is thinned by thermal oxidation, or etching, to a desired thickness, which is preferably between about 10 nm and 30 nm. Device isolation is accomplished by etching silicon islands for mesa isolation, or by a LOCOS process.

U.S. Pat. No. 6,501,134 of Krivokapic entitled "Ultra Thin SOI Devices with Improved Short-Channel Control" shows an SOI device with a buried oxide layer usually undoped $SiO_2$ with thickness of approximately 50–60 nm, atop a bulk substrate. Above the buried oxide layer is an undoped ultra-thin undoped SOI silicon layer which has a thickness between 5–20 nm. Above the SOI silicon layer a gate dielectric is formed comprised of silicon dioxide or alternately silicon nitride, aluminum oxide, tantalum pentoxide or hafnium oxide with equivalent oxide thickness of 0.8–1.4 nm. A conducting metal gate electrode is deposited and patterned from TiN, TaN, TaW, W, Al, Ni, Ta, Mo, or Cr, and has thickness of approximately 2.5–25 nm, with gate length of 30–60 nm. A polysilicon encapsulation layer with thickness of 50–100 nm is deposited on and patterned with the gate electrode. The patent states that "Encapsulation layers in general are necessary to prevent cross-contamination of the fab line during post-gate formation processing." The patent indicates that "10–15 nm polysilicon is deposited and anisotropically etched to form poly spacers which when doped function as side gates." There is no indication that the SOI silicon layer is ever doped to form a doped channel region and the source region and the drain region are formed in the SOI layer.

Zhang U.S. patent application No. 20020060338 A1 entitled "Methods of Fabricating Vertical Field Effect Transistors by Conformal Channel Layer Deposition on Sidewalls and Vertical Field Effect Transistors Fabricated Thereby" stated as follows: "In attempts to reduce short channel effects, planar fully depleted ultra-thin body Semiconductor-On-Insulator (SOI) FETs have been developed. For example, using a semiconductor-on-insulator substrate and etchback or oxide thinning, ultra-thin SOI channels may be obtained. See, for example, Choi et al., "Ultra-Thin Body SOI MOSFET for Deep-Sub-Tenth Micron Era", Paper 3.7.1, IEDM, 1999, pp. 919–921. Other approaches have deposited a thin layer of amorphous silicon or silicon germanium alloy on a planar oxide surface, followed by lateral solid-state crystallization. See, Yeo et al., Nanoscale Ultra-Thin-Body Silicon-On-Insulator P-MOSFET with a SiGe/Si Hetero-structure Channel, IEEE Electron Device Letters, Vol. 21, No. 4, 2000, pp. 161–163."

SUMMARY OF INVENTION

As indicated above, it is well known in the prior art is that the reduction in the depletion layer thickness is realized by a super-step retrograded well (SSRW) ion implantation process. However, there is the problem that such devices have been rejected for smaller dimensions, because the process is limited by the diffusion of dopant atoms during subsequent thermal processes (e.g., annealing). As stated in Yu et al U.S. Pat. No. 6,084,271 cited above, "The ion implantation process can generally only achieve a 80 nanometer or larger body thickness for a transistor. Thus, conventional fabrication techniques for bulk semiconductor type-devices cannot create transistors with body thickness less than 80 nm."

An object of this invention is to ensure that there is extraordinary inversion carrier transport (mobility).

Another object of this invention is to provide enhanced control of the SCE (Short Channel Effect).

Still another object of this invention is to provide reduced junction capacitance and junction leakage.

A further object of this invention is to minimize the space-charge related fluctuation of threshold voltage (Vth), to provide enhanced manufacturability of MOSFET devices.

Advantages of the present invention which meet the above defined objectives of the invention are as follows:
1. The intrinsic channel layer and low surface vertical electric field resulted from positioning highly doped layer (SSRW) further away from the gate dielectric ensure the extraordinary inversion carrier transport (mobility)
2. Ultra-thin SOI and heavily doped SSRW provide the superior control of SCE (Short Channel Effect) space.
3. The use of Ultra-thin SOI can significantly reduce junction capacitance and junction leakage.
4. The partially depleted body and undoped surface layer can greatly minimize the space-charge related fluctuation of threshold voltage (Vth), which is a very important issue for manufacturability.

In accordance with one aspect of this invention, a method of manufacture of a Super Steep Retrograde Well (SSRW) FET (Field Effect Transistor) device is provided including the following steps. Form an SOI layer on a substrate. Thin the SOI layer to form an ultra-thin SOI layer. Form an isolation trench separating the SOI layer into N and P ground plane regions. Dope the N and P ground plane regions formed from the SOI layer with N-type and P-type dopant respectively. Form semiconductor channel regions above the N and P ground plane regions. Form gate electrode stacks above the channel regions and FET source and drain regions. Preferably, the SOI layer is thinned by successive oxidation and stripping steps forming a thinned SOI layer. Preferably a pad oxide and a pad nitride layer are formed over the thinned SOI layer. Preferably an isolation trench is formed in the device separating the thinned SOI layer into first and second regions. Preferably an isolation dielectric is formed filling the isolation trench. Preferably, the first and second regions are ion implanted with N-type dopant and P-type dopant to form an SOI N-well and an SOI P-well respectively. Preferably, an intrinsic epitaxial layer is formed above each of the SOI N-well and the SOI P-well respectively. Preferably, in situ counter doping is provided in the epitaxial layers. Preferably, a liner is formed in the isolation trench prior to forming the isolation dielectric. Preferably, a sacrificial layer is applied before forming the N-well and the P-well and is stripped away thereafter. Preferably a diffusion retarding barrier is formed in the surface of the N and P ground plane regions prior to forming the epitaxial layers.

In accordance with another aspect of this invention, a Super Steep Retrograde Well (SSRW) FET (Field Effect Transistor) device is provided with an ultra-thin SOI layer formed on a substrate. An isolation trench separates the SOI layer into N and P ground plane regions. The N and P ground plane regions are formed from the SOI layer doped with high doping levels of N-type and P-type dopant respectively. Semiconductor channel regions are formed above the N and P ground plane regions. FET source and drain regions are juxtaposed with the channel regions and gate electrode stacks are above the channel regions.

The invention and objects and features thereof will be more readily apparent from the following detailed description and appended claims when taken with the drawings.

BRIEF DESCRIPTION OF DRAWINGS

The foregoing and other aspects and advantages of this invention are explained and described below with reference to the accompanying drawings, in which.

DETAILED DESCRIPTION

Figure 3A:
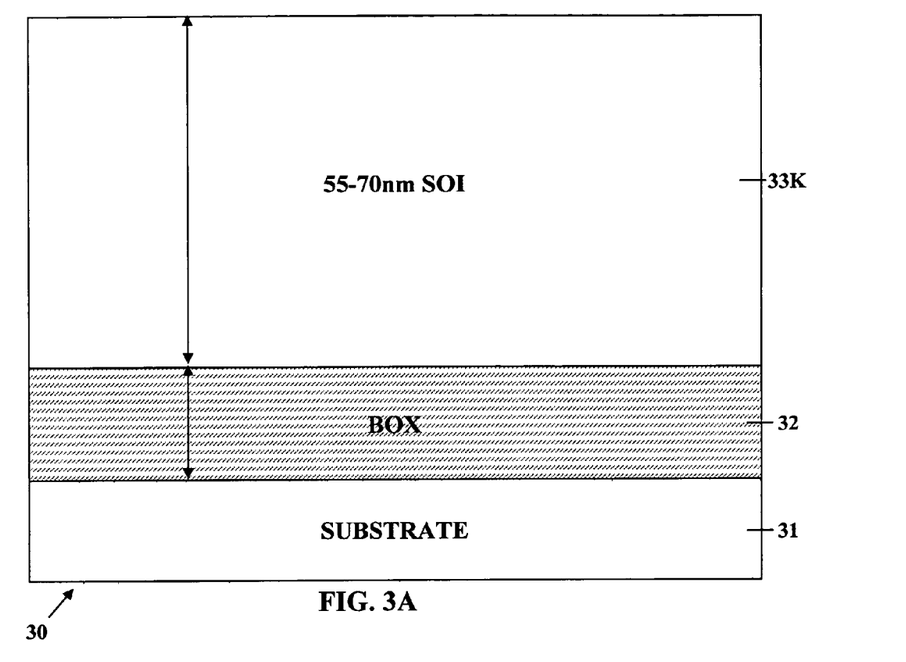
FIGS. 3A–3O illustrate a process for forming a Super Steep Retrograde Well (SSRW) SOI device in accordance with the method of this invention and FIG. 3O shows an example of a finished product made in accordance with the method of this invention.
Figure 3B:
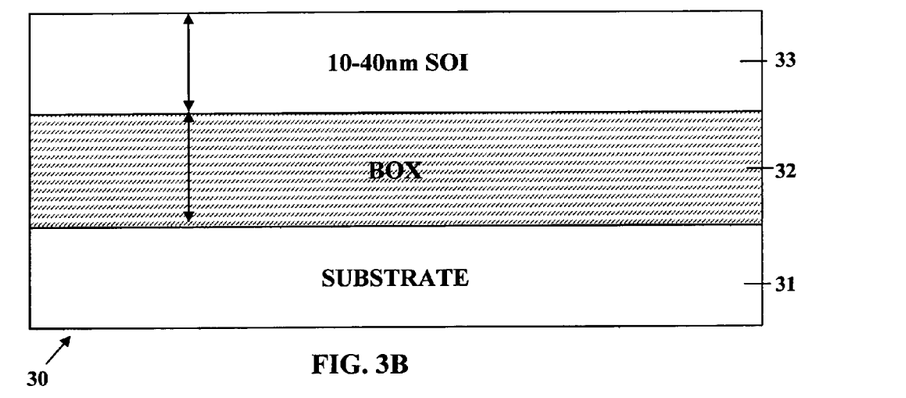
Figure 3C:
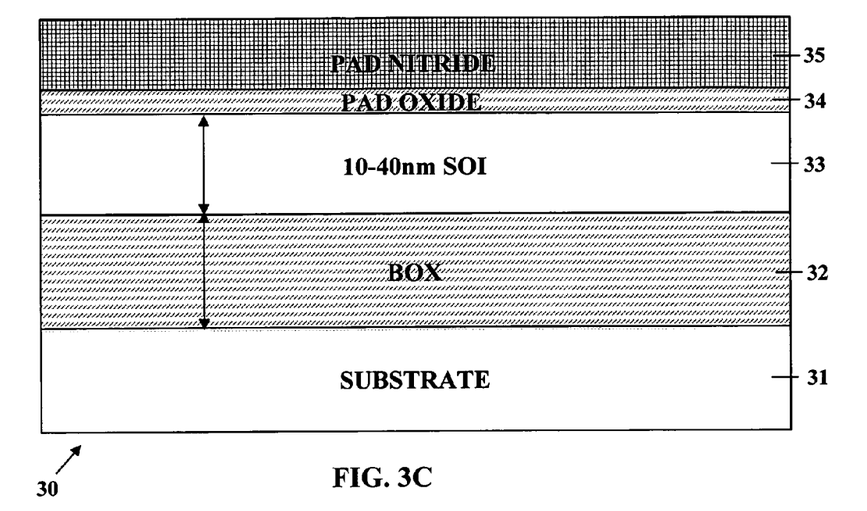
Figure 3D:
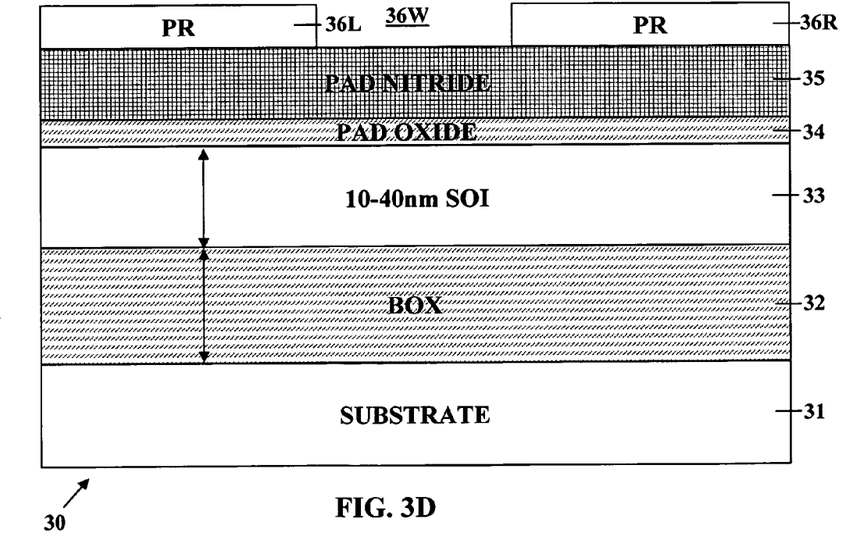
Figure 3E:
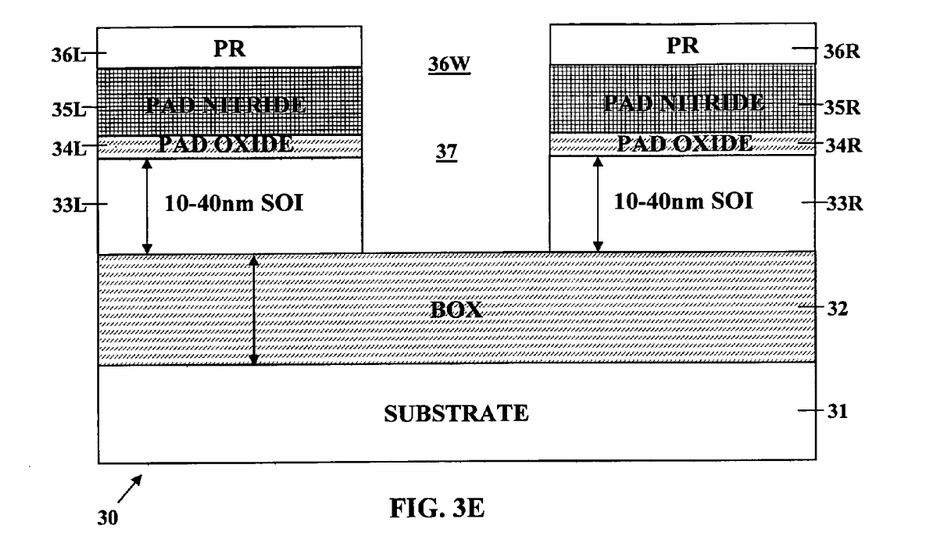
Figure 3F:
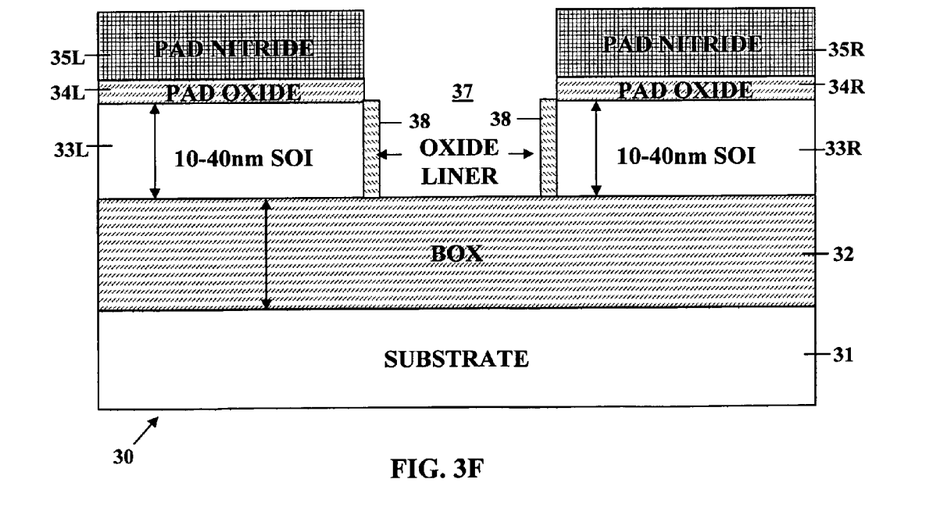
Figure 3G:
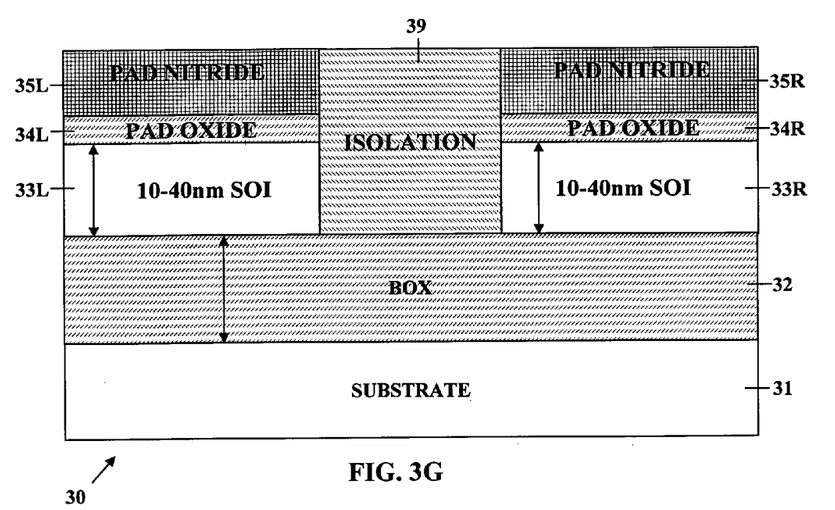
Figure 3H:
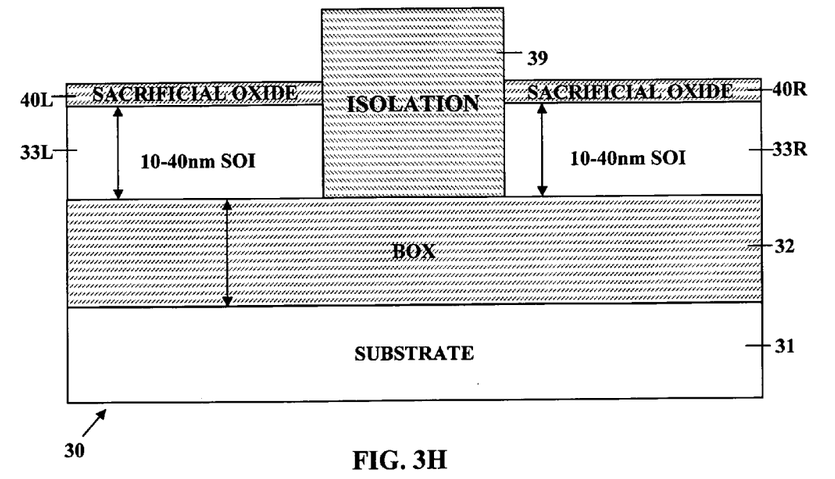
Figure 3I:
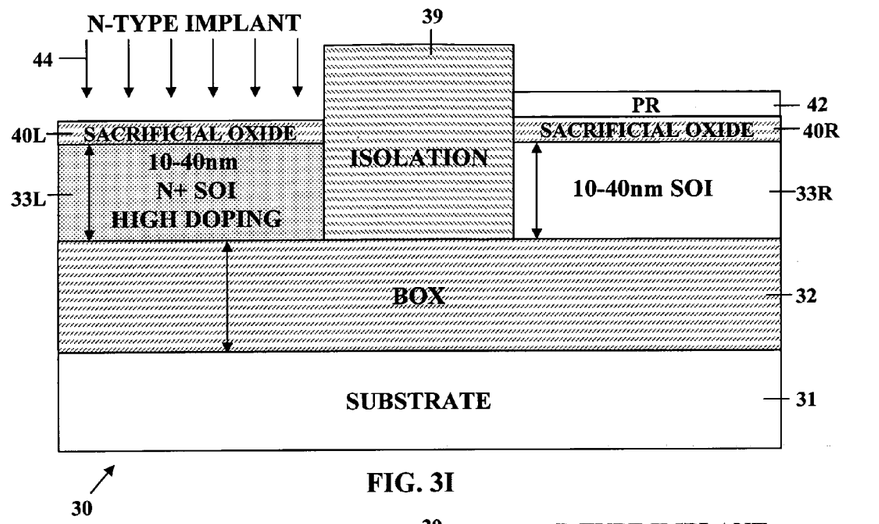
Figure 3J:
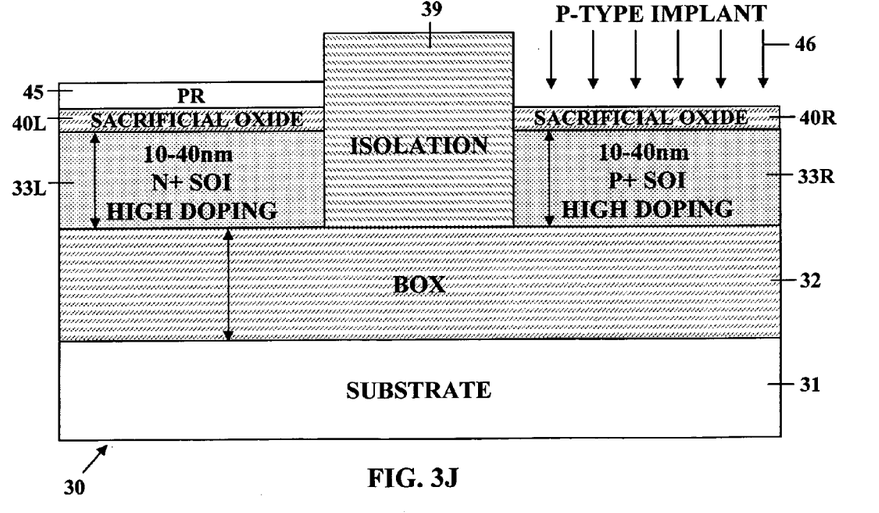
Figure 3K:
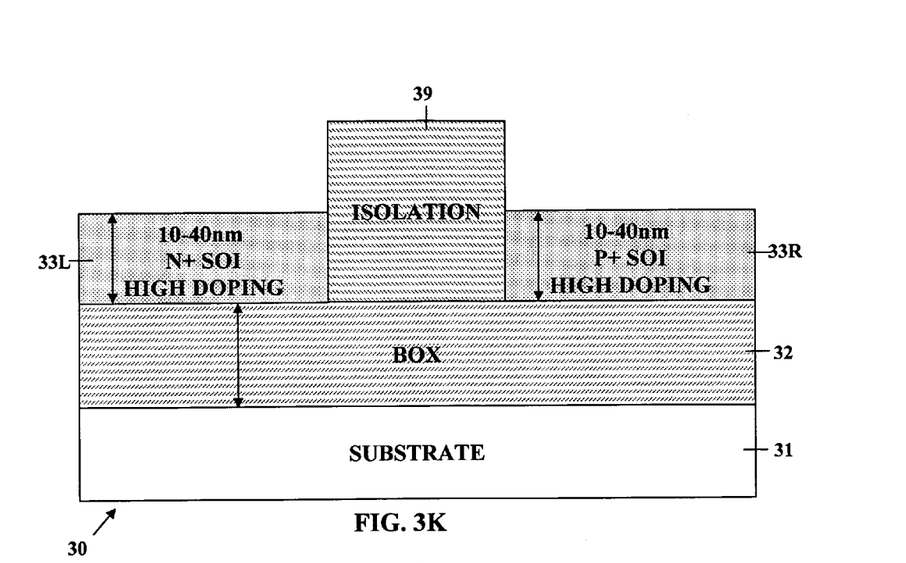
Figure 3L:
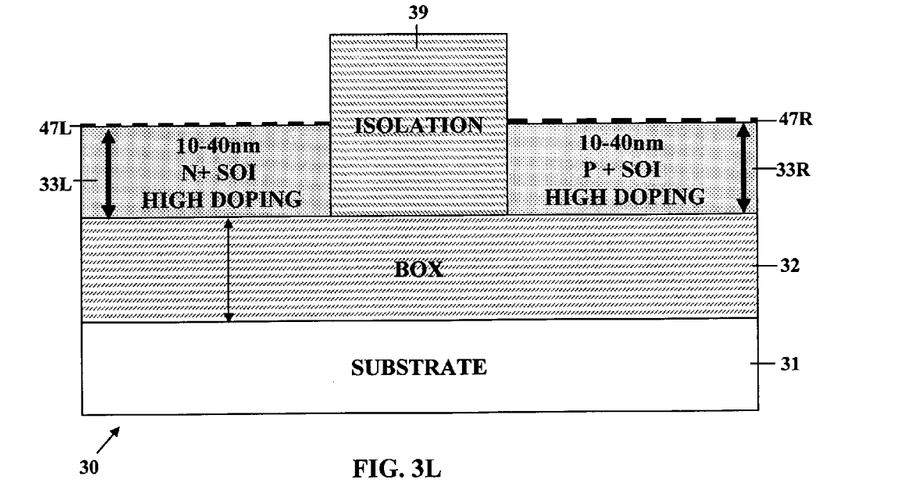
Figure 3M:
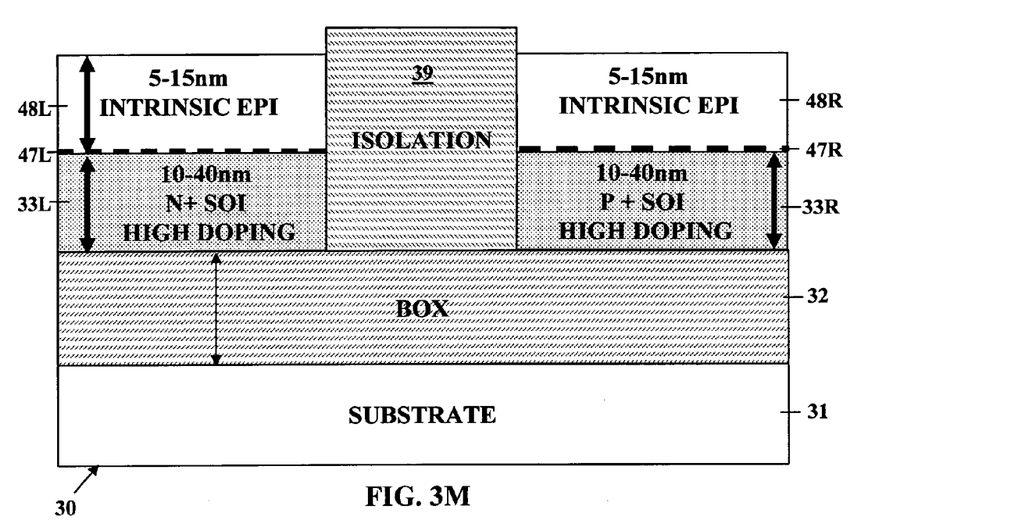
Figure 3N:
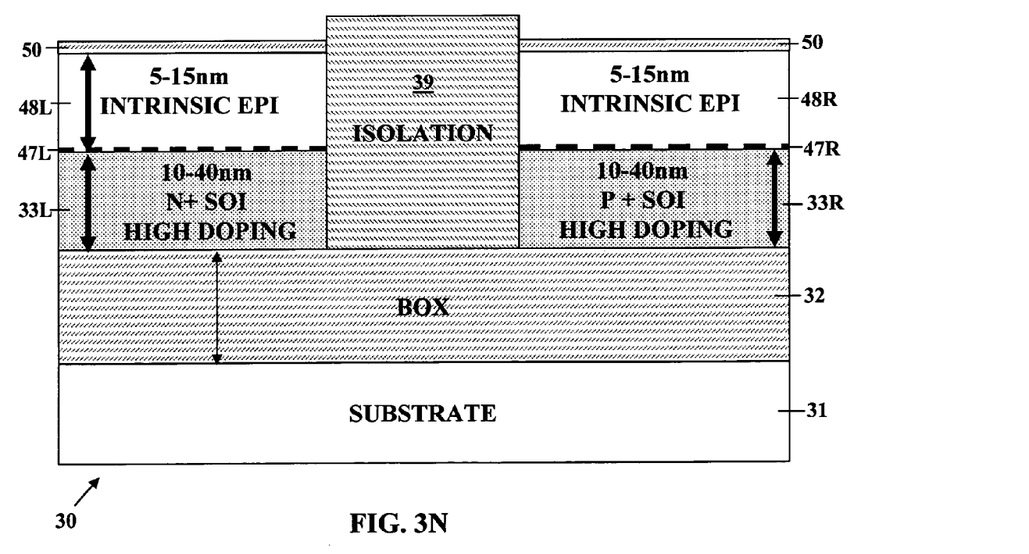
Figure 3O:
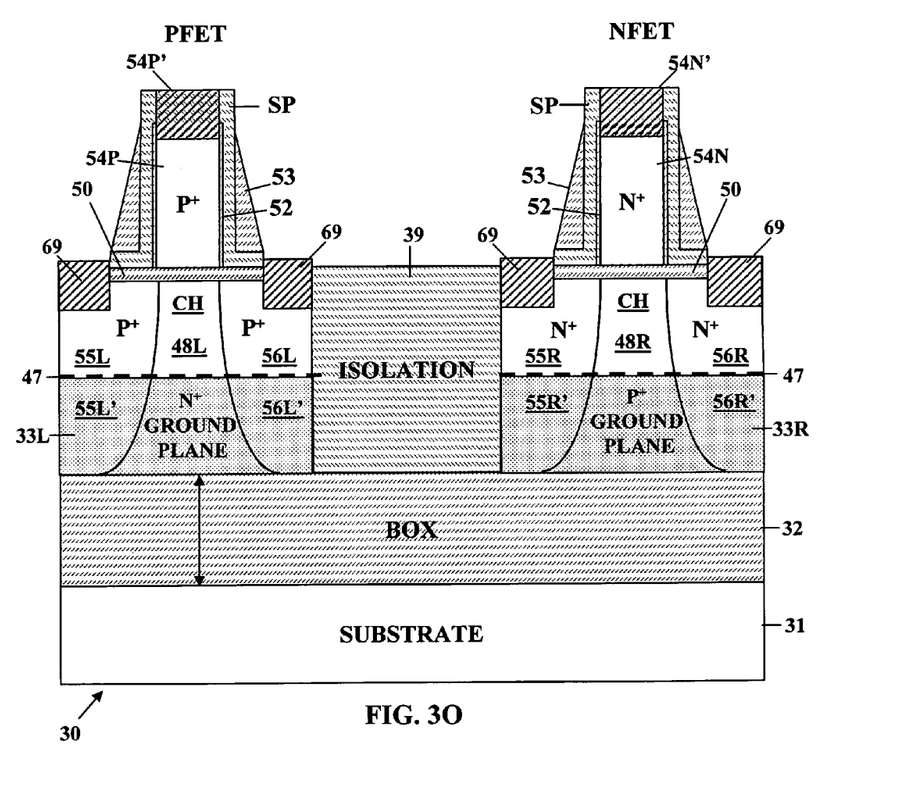

FIGS. 3A–3O illustrate a process for forming a Super Steep Retrograde Well (SSRW) SOI device 30 in accordance with the method of this invention.

FIG. 3A shows the SSRW SOI device 30 in a preliminary stage with a substrate 31 upon which are formed a Buried Oxide (BOX) layer 32 and a thick SOI layer 33K thereabove. The thick SOI layer 33K has been formed with a thickness of about 55 nm or greater.

FIG. 3B shows the device 30 of FIG. 3A after the thick SOI layer 33K has been thinned to form an ultra-thin SOI layer 33 which has a thickness between about 10 nm and about 40 nm as contrasted with most other ultra-thin layers, which are about 50 nm thick or thicker. The SOI layer 33K is oxidized by a process of thermal oxidation. Then the oxidized thickness of layer 33K, not shown for convenience of illustration, is stripped by a process of wet chemical etching.

FIG. 3C shows the device 30 of FIG. 3B after a conventional blanket pad oxide layer 34 and a conventional blanket pad nitride layer 35 have been formed in that sequence over the SOI layer 33 using a conventional process such as thermal oxidation for the pad oxide layer 34 and Chemical Vapor Deposition (CVD) for the pad nitride layer 35. The top surface of the blanket pad nitride layer 35 is exposed.

FIG. 3D shows the device 30 of FIG. 3C after a first patterning mask 36L/36R has been formed over the top surface of the pad nitride layer 35. There is an open central window 36W through in the patterning mask 36L/36R which includes a left mask portion 36L and a right mask portion 36R on either side of the central window 36W. The open central window 36W is adapted for patterning an isolation trench 37 seen in FIGS. 3E and 3F. The isolation trench window 36W provides an opening that exposes a portion of the top surface of the pad nitride layer 35 providing access for etching through the pad nitride layer 35, the pad oxide layer 34 and the ultra-thin SOI layer 33 to form the isolation trench 37.

FIG. 3E shows the device 30 of FIG. 3D after an isolation trench 37 has been etched through the window 36W. The isolation trench 37 extends down through the pad nitride layer 35, the pad oxide layer 34, and the SOI layer 33 down to the top surface of the BOX layer 32. To the left of the isolation trench 37 from top to bottom below the left mask portion 36L are the left pad nitride layer 35L, the left pad oxide layer 34L, and a left SOI region 33L in that order. To the right of the isolation trench 37 from top to bottom below the right mask portion 36R are the right pad nitride layer 35R, the right pad oxide layer 34R, and the right SOI region 33R in that order. The isolation trench is etched by a process such as Reactive Ion Etching (RIE).

FIG. 3F shows the device 30 of FIG. 3E after the patterning mask 36L/36R has been stripped therefrom, leaving the top surface of the pad nitride layer 35L/35R exposed. Then a silicon oxide liner 38 was formed on the side walls of the left SOI layer 33L and the right SOI layer 33R in the isolation trench 37. The silicon oxide liner 38 is formed by a process such as thermal oxidation.

FIG. 3G shows the device 30 of FIG. 3F after an isolation region 39, preferably comprising a Shallow Trench Isolation (STI) region has been formed in the isolation trench 37. The isolation region 39 is formed by depositing silicon oxide therein filling the isolation trench 37 and incorporating the silicon oxide liner 38 as an integral part of the silicon oxide in the isolation region 39. Preferably, the process used to deposit the silicon oxide to form isolation region 39 is High Density Plasma Chemical Vapor Deposition (HDPCVD).

The silicon oxide of the isolation region 39 is then planarized, preferably by Chemical Mechanical Planarization (CMP) to lower the STI layer 39 to expose the top surface of the pad nitride layer 35L/35R.

FIG. 3H shows the device 30 of FIG. 3G after stripping the pad nitride layer 35L/35R and the pad oxide layer 34L/34R from the device 30, preferably by a process of wet chemical etching.

Then sacrificial silicon oxide layers 40L/40R are formed over the remaining portions of the left SOI region 33L and the right SOI region 33R which are juxtaposed with the isolation region 39 to the left and the right thereof. The sacrificial oxide layers 40L/40R are formed by a process such as thermal oxidation.

Ion Implant High Levels of N+ and P+ Dopant into SOI Layers to Form Well Regions.

FIG. 3I shows the device 30 of FIG. 3H after a second photoresist (PR) mask 42 has been placed over the top surface of the sacrificial silicon oxide layer 40R to the right of the isolation region 39, leaving the sacrificial silicon oxide layer 40L to the left of the isolation region 39 exposed in preparation for doping of the left SOI region 37L. In FIG. 3I, the implantation of N-type dopant ions 44 through the sacrificial silicon oxide layer 40L into the left SOI region 37L is performed to form a left SOI well region 37L. Preferably, the N-type dopant comprises arsenic (As) ions 44 which are implanted at an energy of between about 15 keV and about 30 keV in an implanter tool yielding a concentration of arsenic atoms from about 1E13 atoms/cm$^3$ to about 7E13 atoms/cm$^3$. An additional 60 KeV As implant of 2e13 cm-3 is used for a 40 nm ground plane to achieve deep well implant and shut off bottom leakage channel.

FIG. 3J shows the device 30 of FIG. 3I after the second photoresist mask 42 has stripped from the top surface of the sacrificial silicon oxide layer 40R to the right of the isolation region 39; and a third photoresist (PR) mask 45 has been placed over the top surface of the sacrificial silicon oxide layer 40L to the left of the isolation region 39, leaving the top surface of the sacrificial oxide layer 40R to the right of the isolation region 39 exposed in preparation for doping of the right SOI region 37R. In FIG. 3J, the implantation of P-type dopant ions 46 through the sacrificial oxide layer 40R into the right SOI region 37R is performed to form a right SOI well region 37R. The preferred P-type dopant comprises Boron (B) ions 46, which are preferably implanted at an energy of between about 2 keV and about 12 keV in an implanter tool yielding a concentration of Boron atoms from about 1E13 atoms/cm$^3$ to about 1.1E14 atoms/cm$^3$.

FIG. 3K shows the device 30 of FIG. 3J the third photoresist mask 45 has been stripped away from the device 30 leaving the top surfaces of both of the sacrificial silicon oxide layers 40L/40R exposed. Then the sacrificial silicon oxide layers 40L/40R were stripped away from the left SOI well region 33L and the right SOI well region 33R, preferably by the process of wet etching, leaving the top surfaces of the left SOI region 33L and the right SOI region 33R exposed.

FIG. 3L shows the device 30 of FIG. 3K after an optional step has been performed providing a dopant diffusion retarding barrier 47L/47R (shown in phantom by dotted lines) over the N+ SOI well region 33L and the P+ SOI well region 33R. The dopant diffusion retarding barrier 47L/47R is provided to slow down doping diffusion from the well regions 33L/33R up into regions 48L/48R shown in FIG. 3L which are to be formed thereabove.

Optional Diffusion Retardation Process

1. To form the dopant diffusion retarding barrier 47L/47R, the top surfaces of the well regions 33L/33R are treated with co-implantation of doping diffusion retarding ions into the top surface of the regions 33L/33R. Examples of such ions are carbon (C) germanium (Ge) and/or xenon (Xe) into the top surface of the 33L/33R layers.

2. Alternatively, the surfaces of the SOI N+/P+ doped well regions 33L/33R can be treated with a monolayer of dopant diffusion retardation agent such as Si—O—CH$_3$ methoxy termination; an alkyl termination; silicon carbide (SiC) grown in situ; or silicon Germanium (SiGe) grown in situ. The dopant diffusion retardation coating produced, which is to serve as the dopant diffusion retarding barrier 47L/47R must be maintained relatively thin (less than a single nm or a few nm) in order to permit subsequent growth of epitaxial silicon on the surface thereof with the lattice structure of the underlying SOI N+/P+ doped well regions 33L/33R.

EXAMPLE I

In this example, two Silicon-On-Insulator (SOI) substrates, each having an SOI layer that has a thickness of about 55 nm were employed. Each of the SOI substrates, in particular each SOI layer, was doped with boron (B) by ion implantation using an ion dose of 2E13 B atoms/cm$^2$ implanted at an energy of 10 keV in an ion implanter tool. The samples were then annealed at about 1000° C. for less than 10 seconds. Each SOI substrate was then subjected to a step in which the SOI layer was hydrogen terminated. The hydrogen termination was provided by applying dilute hydrofluoric acid to each of the SOI substrates at room temperature. After hydrogen termination, one of the SOI substrates was soaked at room temperature in a solution of 5×10$^{-4}$ M iodine in methanol to provide a methoxy termination comprising carbon and oxygen bonded to the SOI layer as a monolayer of Si—O—CH$_3$. The iodine/methanol soak occurred at room temperature for about 20 minutes. The soaked SOI substrate was then rinsed with methanol and dried utilizing a standard surface tension gradient drying process. An epitaxial silicon (Si) layer having a thickness of about 40 nm was deposited at 750° C. on each of the SOI substrates processed as stated above. The SOI substrate that was not subjected to the iodine/methanol treatment represents a comparative sample, while the SOI substrate treated with iodine/methanol is representative of the present invention. The boron SIMS data for each sample was then collected after deposition and after a post deposition anneal at a temperature of 1000° C. for 5 seconds. Data collected included the boron SIMS data for the above experimentation for the comparative sample after post deposition annealing; data for the comparative sample after deposition of the Si overlayer (prior to annealing); data for the inventive sample after the post deposition anneal and data representing the inventive sample after deposition of the Si overlayer (prior to annealing). The SIMS data showed that the sample of the present invention, as deposited and after performing the post deposition anneal, had less boron diffusion into the Si overlayer than the sample without the treatment step of the present invention.

EXAMPLE II

Another SOI substrate was processed using the iodine/methanol treatment method of the present invention described above and thereafter the sample was annealed in vacuum at 850° C. and then an epitaxial Si overlayer having a thickness of about 30 nm was deposited at 850° C. A high-resolution (3 nm scale) TEM image and low resolution (50 nm scale) TEM of this sample were made. The TEMs illustrate that the iodine/methanol treatment step of the present invention does not disrupt the epitaxial alignment of the Si overlayer on the lattice structure of the original SOI layer. The carbon and oxygen doses for the interface between the SOI layer and the Si overlayer were 1.1E14 atoms/cm$^2$ and 1.1E13 atoms/cm$^2$, respectively. The interface is not visible by TEM, and the lattice of the SOI substrate is not distinguishable from the epitaxial Si overlayer.

Form Intrinsic Epitaxial Layers Over SOI Regions

FIG. 3M shows the device 30 of FIG. 3L after formation of ultra-thin intrinsic epitaxial regions 48L/48R having a thickness between about 5 nm and about 15 nm which are to be employed as intrinsic channel regions over the highly doped SOI N+/P+ doped well regions 33L/33R respectively. The epitaxial regions 48L/48R are grown anisotropically vertically, aside from the isolation region 39, by a process of RTCVD (Rapid Thermal Chemical Vapor Deposition) based upon the crystalline structure of the SOI regions 33L/33R.

FIG. 3N shows the device 30 of FIG. 3M after formation of a thin gate dielectric layer 50 on the exterior surfaces of the intrinsic epitaxial regions 48L/48R. The gate dielectric layer 50 may comprise a gate oxide (silicon dioxide) or any other well known gate dielectric such as nitrided silicon oxide, hafnium-silicon dioxide (HfO$_2$), hafnium-silicon monoxide (HfO), zirconium oxide (ZrO), or aluminum dioxide (AlO$_2$).

FIG. 3O shows the device 30 of FIG. 3N after formation of PFET and NFET devices including P+ gate electrode 54P and N+ gate electrode 54N above the gate dielectric layer 50, with upper drain regions 55L/55R and source regions 56L/56R juxtaposed with the channel regions CH in epitaxial regions 48L/48R aside from the gate electrodes 54P/54N. There are lower drain regions 55L'/55R' and lower source regions 56L'/56R' formed in the doped well regions 33L/33R which include ground planes respectively below the gate electrodes 54P/54N respectively. The lower source regions 55L'/55R' and the lower drain regions 56L'/56R' are shown reaching down to the buried oxide layer 32 through the heavily doped SOI/ground plane/doped well regions 33L/33R, ensuring a minimized junction area. Therefore junction capacitance and leakage are minimized. The channel regions CH are formed in the intrinsic epitaxial regions 48L/48R and thus, as in FIG. 3N, they are located above the N+/P+ highly doped SOI/doped well regions 33L/33R which include ground planes therein. Silicide contacts 69 are provided to the source/drains regions 56/55. Silicide regions 54P'/54N' are formed above the gate electrodes 54P/54N. Silicon oxide extension spacers 52, dielectric sidewall spacers SP and TEOS/Source Drain spacers 53 can be formed aside from the gate electrodes 54.

First Embodiment of the Method of the Invention

Figure 4:
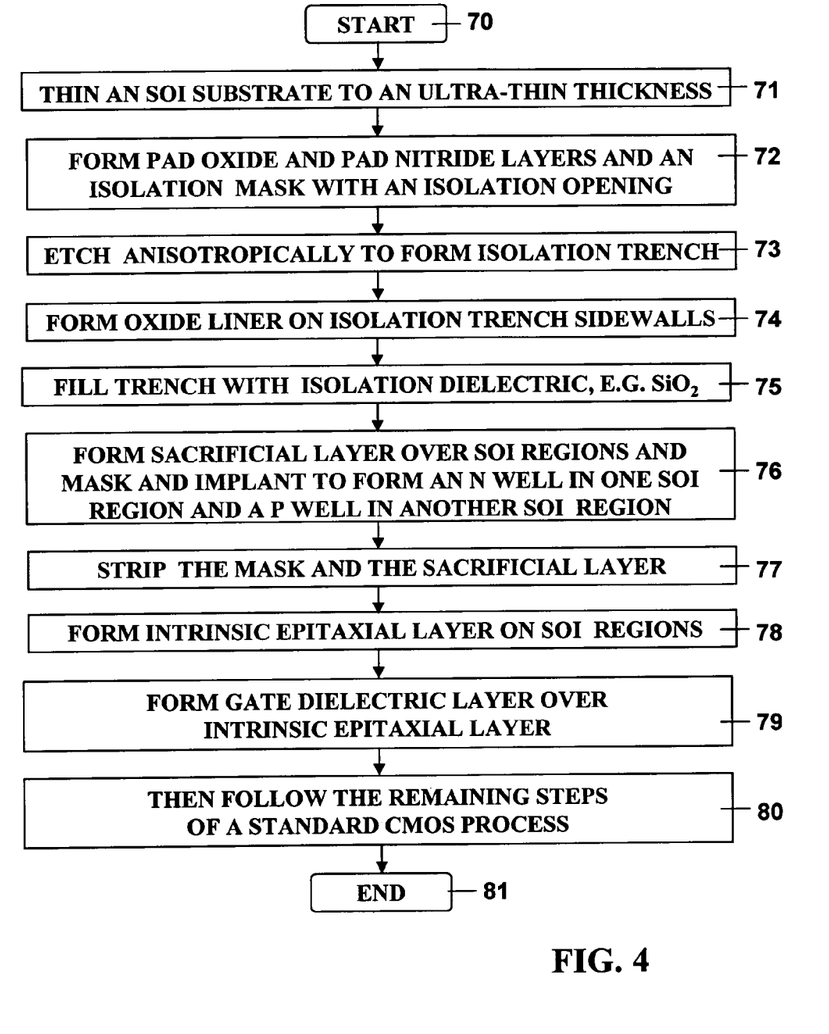
FIG. 4 shows a flow chart of a first embodiment of the method of this invention.

FIG. 4 shows a flow chart of a first embodiment of the method of this invention. The process illustrated by FIG. 4 begins at Start 70 and continues to step 71 in which device 30 is processed. The SOI layer 33K on BOX substrate 31 which initially had a thickness of 55 nm or more in FIG. 3A is thinned to an ultra-thin thickness from about 10 nm to about 40 nm by a process of oxidation and stripping as described above with reference to FIG. 3B.

At the end of step 71, the desired thickness of the SOI layer 33 has been reached.

In step 72, pad oxide layer 34, pad nitride layer 35 were formed as shown in FIG. 3C over the thinned SOI layer 33. Then, as shown in FIG. 3D, an isolation patterning mask 36L/36R with a central isolation opening 36W therethrough was formed over the pad nitride layer 35 (above the SOI layer 33).

In step 73, an isolation trench 37 was formed by etching from the top of the device 30 down through the isolation window 36W with the trench reaching through the pad nitride layer 35, the pad oxide layer 34, and the SOI layer 33 down to the top surface of the BOX layer 32, as described below with reference to FIG. 3E.

In step 74, an oxide liner 38 is formed in the isolation trench 37 on the sidewalls of the SOI well regions 33L/33R as shown in FIG. 3F.

In step 75, the isolation trench 37 was filled with an isolation dielectric material such as silicon oxide to form an isolation region 39 as shown in FIG. 3G. The isolation region comprises an STI or a Mesa isolation structure, as will be well understood by those skilled in the art.

In step 76, a sacrificial layer 40L/40R of silicon oxide or the like is formed on the top surfaces of the SOI well regions 33L/33R in FIG. 3H.

Next, as illustrated by FIG. 3I, a mask 42 is formed over the top surface of the sacrificial layer 40R to protect the SOI region 33R; and N-type dopant is ion implanted into the left SOI well region 33L to a high N+ doping level as described above with reference to FIG. 3I.

Next, as illustrated by FIG. 3J, the mask 42 is stripped and another mask 45 is formed over the top surface of the sacrificial layer 40L to protect the SOIL N+ doped well region 33L; and P-type dopant is ion implanted into the right SOI well region 33R to a high P+ doping level as described above with reference to FIG. 3J.

In step 77, the mask 45 and the sacrificial layer 40L/40R are stripped as illustrated by FIG. 3K.

FIG. 3L pertains to an optional step which is included in the second embodiment of the process and is described above and will be further described in further detail below.

In step 78, ultra-thin intrinsic epitaxial regions 48L and 48R having a thickness ranging from about 5 nm to about 15 nm are formed above the SOI well regions 33L and 33R respectively as shown in FIG. 3M.

In step 79, as shown by FIG. 3N, a gate dielectric layer 50 is shown formed over the intrinsic epitaxial regions 48L/48R respectively.

In step 80, the completion of formation of device 30 by the process of the first embodiment of the method of this invention can employ any of the processes well known by those skilled in the art of forming whatever CMOS device is desired in accordance with the choice of the manufacturer as illustrated by FIG. 3O. Step 81 is the end of the process of the first embodiment of the invention.

Second Embodiment of the Method of the Invention

Figure 5:
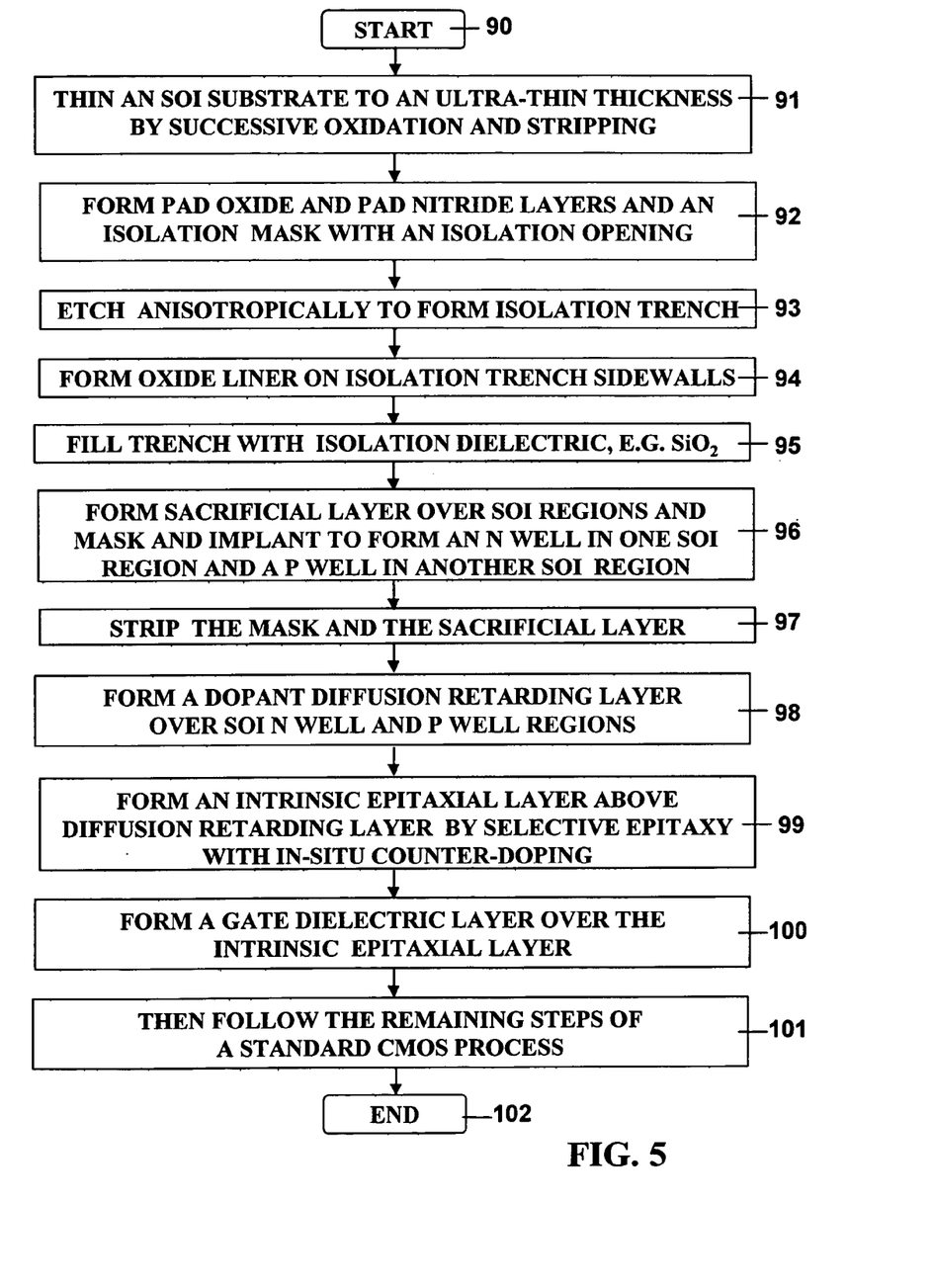
FIG. 5 shows a flow chart of a second embodiment of the method of this invention.

FIG. 5 shows a flow chart of a second embodiment of the method of this invention. The process illustrated by FIG. 5 begins at Start 70 and continues to step 91 during which device 30 is processed. The SOI layer 33K on BOX substrate 31, which initially had a thickness of 55 nm or more in FIG. 3A, is thinned to an ultra-thin thickness from about 10 nm to about 40 nm by a process of oxidation and stripping as described above with reference to FIG. 3B.

At the end of step 91, the desired thickness of the SOI layer 33 has been reached.

In step 92, pad oxide layer 34, pad nitride layer 35 were formed as shown in FIG. 3C over the thinned SOI layer 33. Then, as shown in FIG. 3D, an isolation patterning mask 36L/36R with a central isolation opening 36W therethrough was formed over the pad nitride layer 35 (above the SOI layer 33).

In step 93, an isolation trench 37 was formed by etching from the top of the device 30 down through the isolation window 36W with the trench reaching through the pad nitride layer 35, the pad oxide layer 34, and the SOI layer 33 down to the top surface of the BOX layer 32, as described below with reference to FIG. 3E.

In step 94, an oxide liner 38 is formed in the isolation trench 37 on the sidewalls of the SOI regions 33L/33R as shown in FIG. 3F.

In step 95, the isolation trench 37 was filled with an isolation dielectric material such as silicon oxide to form an isolation region 39 as shown in FIG. 3G. The isolation region comprises an STI or a Mesa isolation structure, as will be well understood by those skilled in the art.

In step 96, a sacrificial layer 40L/40R of silicon oxide or the like is formed on the top surfaces of the SOI well regions 33L/33R in FIG. 3H.

Next, as illustrated by FIG. 3I, a mask 42 is formed over the top surface of the sacrificial layer 40R to protect the SOI well region 33R; and N-type dopant is ion implanted into the left SOI well region 33L to a high N+ doping level as described above with reference to FIG. 3I.

Next, as illustrated by FIG. 3J, the mask 42 is stripped and another mask 45 is formed over the top surface of the sacrificial layer 40L to protect the SOI well region 33L; and P-type dopant is ion implanted into the right SOI well region 33R to a high P+ doping level as described above with reference to FIG. 3J.

In step 97, the mask 45 and the sacrificial layer 40L/40R are stripped as illustrated by FIG. 3K.

In step 98, as indicated by FIG. 3L, a dopant diffusion retarding barrier 47L/47R is formed over the highly doped SOI well regions 33L/33R.

Two processes for forming an optional dopant diffusion retarding barrier 47L/47R are as follows:

Optional Diffusion Retardation Process

1. To form the dopant diffusion retarding barrier 47L/47R, the top surfaces of the well regions 33L/33R are treated with co-implantation of doping diffusion retarding ions into the top surface of the well regions 33L/33R. Examples of such ions are carbon (C) germanium (Ge) and/or xenon (Xe) into the top surface of the 33L/33R layers.

2. Alternatively, the surfaces of the SOI well regions 33L/33R can be treated with a monolayer of dopant diffusion retardation agent such as Si—O—CH$_3$ methoxy termination, an alkyl termination, or silicon carbide (SiC) grown in situ, or silicon Germanium (SiGe) grown in situ. The dopant diffusion retardation coating produced, which is to serve as the dopant diffusion retarding barrier 47L/47R must be maintained relatively thin (less than a single nm or a few nm) in order to permit subsequent growth of epitaxial silicon on the surface thereof with the lattice structure of the underlying SOI regions 33L/33R.

In step 99 ultra-thin intrinsic epitaxial regions 48L and 48R having a thickness ranging from about 5 nm to about 15 nm are formed above the SOI well regions 33L and 33R respectively as shown in FIG. 3M.

In step 100, as shown by FIG. 3N, a gate dielectric layer 50 is shown formed over the intrinsic epitaxial regions 48L/48R respectively.

In step 101, the completion of formation of device 30 by the process of the second embodiment of the method of this invention can employ any of the processes well known by those skilled in the art of forming whatever CMOS device is desired in accordance with the choice of the manufacturer as illustrated by FIG. 3O. Step 102 is the end of the process of the second embodiment of the invention.

In summary, in this invention, the SSRW approach is combined with an ultra-thin body structure to minimize the junction area, thereby solving the above described problems. This invention teaches a method and structure to build ultra-thin body SSRW MOSFETs for high-performance CMOS applications.

Process Highlights Include:

Start with SOI substrate, STI OR Mesa, and well ion implantation.

Then the SOI surface is pre-treated to form a dopant diffusion barrier in the surface thereof (for example, Si—O—CH3 methoxy termination) to slow down boron diffusion, helping form a super-steep retrograde ground plane profile.

Optional surface treatment to retard dopant diffusion.

Process highlights: selective Silicon (Si) epitaxy is employed to form the intrinsic channel layers for both pFETs and nFETs.

5 nm–15 nm intrinsic epitaxy 10 nm–40 nm SOI high doping.

The benefits of this invention include the factors as follows:
1. The intrinsic channel layer ensures the good inversion carrier transport (mobility)
2. Ultra-thin SOI and heavily doped SSRW provide for superior control of SCE.
3. The use of ultra-thin SOI can reduce junction capacitance and junction leakage significantly.

4. Variations in threshold voltage due to doping fluctuation are minimized, which is a very important issue for manufacturability.

Process Flow (1):

Start with an SOI substrate.

The SOI substrate is thinned to a desired thickness of 10 nm–40 nm by successive steps of oxidation and stripping.

Provide isolation regions such as shallow trenches or Mesa isolation.

Selective Ion implantation for nFET regions and pFET regions.

Diffusion Retardation Coating

Optional features of the invention which can be employed to retard the rate of diffusion of dopant in the device.
1) Carbon, germanium (Ge), and/or xenon (Xe) co-implant.
2) The SOI surface is pre-treated with a dopant diffusion retardation agent. (for example, Si—O—CH3 methoxy termination; silicon carbide (SiC) grown in situ; or silicon Germanium (SiGe) grown in situ).

Process Flow (2): Selective Silicon Epitaxy

Selective silicon epitaxy is employed to form the intrinsic channel layers for both pFET devices and nFET devices. Optionally in-situ counter-doping can be added during the selective epitaxial process to allow greater range for threshold tuning.

Process Flow (3):

The remainder of the process follows the conventional CMOS flow:

for a gate dielectric layer such as silicon oxide, deposition of gate conductor material, e.g. doped polysilicon, for the gate electrode, patterning gate conductor material to form the gate electrode, perform halo implants (optional), perform formation of lightly doped source/drain extension regions, form spacers on gate electrode sidewalls, perform source drain implants, anneal, silicidation, contacts Back-End-Of-Line (BEOL)

Highlights

1. The intrinsic channel layer ensures the extraordinary inversion carrier transport (mobility).
2. Ultra-thin SOI and heavily doped SSRW provide the superior control of SCE (Short Channel Effect).
3. The use of Ultra-thin SOI can significantly reduce junction capacitance and junction leakage.
4. The partially depleted body can greatly minimize the space-charge related Vth fluctuation, which is a very important issue for manufacturability.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the following claims.

What is claimed is:

1. A method of manufacture of a Super Steep Retrograde Well (SSRW) FET (Field Effect Transistor) device comprising:

forming an SOI layer on a substrate;

thinning said SOI layer to form an ultra-thin SOI layer;

forming an isolation trench separating said SOI layer into an N well and a P well including ground plane regions in said N well and in said P well, each of said N well and said P well having a top surface;

doping said N well and said P well formed in said SOI layer with N-type and P-type dopant respectively;

forming an epitaxial semiconductor layer on said top surfaces of said N well and said P well;

forming gate electrode stacks above said epitaxial semiconductor layer with channel regions therebelow; and forming FET source regions and drain regions in said epitaxial layer and in both said N well and said P well.

2. The method of claim 1 wherein said SOI layer is thinned by successive oxidation and stripping steps forming a thinned SOI layer.

3. The method of claim 2 wherein a pad oxide and a pad nitride layer are formed over said thinned SOI layer prior to forming said isolation trench.

4. The method of claim 3 including:

stripping said pad oxide and said pad nitride after said isolation trench is formed in said device, and then forming a sacrificial oxide layer over said N and P ground plane regions prior to doping said N and P ground plane regions; and then stripping said sacrificial oxide layer.

5. The method of claim 1 wherein an isolation dielectric is formed filling the isolation trench prior to doping said N and P wells.

6. The method of claim 5 wherein said N and P wells are ion implanted with N-type dopant and P-type dopant to form an SOI N-well and an SOI P-well respectively prior to forming said semiconductor channel regions directly on said N and P wells.

7. The method of claim 1 wherein in situ counter doping is provided in the epitaxial layers.

8. The method of claim 7 wherein a liner is formed in the isolation trench prior to forming the isolation dielectric.

9. The method of claim 7 wherein a sacrificial layer is applied before forming the N-well and the P-well and is stripped away thereafter.

10. A method of manufacture of a Super Steep Retrograde Well (SSRW) FET (Field Effect Transistor) device comprising:

forming an SOI layer on a substrate;

thinning said SOI layer to form an ultra-thin SOI layer;

forming an isolation trench separating said SOI layer into N and P wells and ground plane regions;

doping the N and P wells and ground plane regions formed from said SOI layer with N-type and P-type dopant respectively;

forming intrinsic semiconductor channel regions above said N and P wells and around plane regions;

forming gate electrode stacks above said channel regions and forming FET source and drain regions; and forming a diffusion retarding barrier in the surface of said N and P wells and ground plane regions.

11. The method of claim 10 wherein the SOI substrate is thinned by successive oxidation and stripping steps forming a thinned SOI layer.

12. The method of claim 11 wherein a pad oxide and a pad nitride layer are formed over said thinned SOI layer.

13. The method of claim 12 wherein an isolation trench is formed in the device separating said thinned SOI layer into first and second regions.

14. The method of claim 13 wherein an isolation dielectric is formed filling said isolation trench.

15. The method of claim 14 wherein the first and second regions are ion implanted with N-type dopant and P-type dopant to form an SOI N-well and an SOI P-well respectively.

16. The method of claim 15 wherein an intrinsic epitaxial layers are formed with an intrinsic epitaxial layer above each of said SOI N-well and said SOI P-well respectively.

17. The method of claim 16 wherein in situ counter doping is provided in said intrinsic epitaxial layer.

18. The method of claim 17 wherein:
a liner is formed in said isolation trench prior to forming said isolation dielectric;
a sacrificial layer is applied before forming said N-well and said P-well and is said sacrificial layer is stripped away thereafter.

19. A Super Steep Retrograde Well (SSRW) FET (Field Effect Transistor) device comprising:

an ultra-thin SOI layer formed on a substrate;

an isolation trench separating said SOI layer into a N type doped N well and a P type doped P well including ground plane regions in said N well and in said P well, each of said N well and said P well having a top surface;

an epitaxial semiconductor layer formed on said top surfaces of said N well and said P well;

gate electrode stacks formed above said epitaxial semiconductor layer with channel regions therebelow; and FET source regions and drain regions formed in said epitaxial layer and in both said N well and said P well.

20. The device of claim 19 wherein a diffusion retarding barrier is formed in the surface of said N and P wells and ground plane regions.

* * * * *